(12) United States Patent
Douzaka

(10) Patent No.: US 8,630,135 B2
(45) Date of Patent: Jan. 14, 2014

(54) SEMICONDUCTOR MEMORY DEVICE

(75) Inventor: Toshiaki Douzaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 13/172,958

(22) Filed: Jun. 30, 2011

(65) Prior Publication Data
US 2012/0147687 A1    Jun. 14, 2012

(30) Foreign Application Priority Data

Dec. 13, 2010  (JP) ................. 2010-277093

(51) Int. Cl.
*G11C 7/00* (2006.01)
(52) U.S. Cl.
USPC ...... 365/194; 365/191; 365/193; 365/189.08; 365/230.06; 365/63
(58) Field of Classification Search
USPC .......... 365/191, 193, 194, 189.08, 230.06, 63
See application file for complete search history.

(56) References Cited

U.S. PATENT DOCUMENTS

| | | | | |
|---|---|---|---|---|
| 5,408,438 A * | 4/1995 | Tanaka et al. | ................. | 365/203 |
| 5,627,789 A * | 5/1997 | Kalb, Jr. | ........................ | 365/205 |
| 5,917,768 A * | 6/1999 | Pascucci | ................. | 365/189.15 |
| 6,229,746 B1 * | 5/2001 | Tooher | ........................ | 365/194 |
| 6,282,131 B1 * | 8/2001 | Roy | ............................. | 365/191 |
| 6,356,503 B1 * | 3/2002 | Roy | ........................ | 365/230.06 |
| 6,529,436 B1 * | 3/2003 | Brown | ........................ | 365/226 |
| 6,580,649 B2 * | 6/2003 | Park | ........................ | 365/189.07 |
| 6,587,371 B1 * | 7/2003 | Hidaka | ........................ | 365/173 |
| 6,717,877 B2 * | 4/2004 | Suzuki et al. | ............ | 365/210.12 |
| 6,738,285 B2 * | 5/2004 | Tanizaki et al. | ............... | 365/158 |
| 6,831,853 B2 * | 12/2004 | Lin et al. | ........................ | 365/154 |
| 6,870,777 B2 * | 3/2005 | Maki | ........................ | 365/189.07 |
| 6,950,362 B2 * | 9/2005 | Kurumada et al. | ........ | 365/210.1 |
| 6,975,528 B2 * | 12/2005 | Do | ................................. | 365/94 |
| 6,977,834 B2 * | 12/2005 | Onizawa et al. | ............... | 365/63 |
| 7,023,752 B2 * | 4/2006 | Ohsawa | ........................ | 365/205 |
| 7,054,211 B2 * | 5/2006 | Tsujimura et al. | ............ | 365/204 |
| 7,355,915 B2 * | 4/2008 | Gouin et al. | ............... | 365/210.1 |
| 7,400,543 B2 * | 7/2008 | Brown et al. | ............... | 365/210.1 |
| 7,477,561 B2 * | 1/2009 | Hirabayashi | ............... | 365/210.1 |
| 7,483,289 B2 * | 1/2009 | Jain | ............................. | 365/154 |
| 7,499,347 B2 * | 3/2009 | Chen et al. | ................... | 365/194 |
| 7,535,784 B2 * | 5/2009 | Tohata et al. | ............... | 365/210.1 |
| 7,646,657 B2 * | 1/2010 | Imai | ........................ | 365/210.13 |
| 7,859,920 B2 * | 12/2010 | Jung et al. | ................ | 365/189.15 |

* cited by examiner

*Primary Examiner* — Viet Q Nguyen
(74) *Attorney, Agent, or Firm* — White & Case LLP

(57) ABSTRACT

A row decoder is disposed on a side of a memory cell array in a column direction and supplies one of word lines with a first drive signal for selecting one of memory cells. A dummy word line is formed extending in the column direction. A dummy bit line is formed extending in a row direction. At least one of the dummy word line and the dummy bit line is disposed outside of the memory cell array. The row decoder outputs a second drive signal toward a sense amplifier circuit via the dummy bit line and the dummy word line.

19 Claims, 19 Drawing Sheets

Cross-Section along C-C'

Cross-Section along D-D'

PSL3  PSL3
 DBL1 DBL2
   DBL

PSL3      PSL3
  DBL2 DBL1
    DBL

Cross-Section along G-G'

Cross-Section along H-H'

Cross-Section along I-I'

Cross-Section along J-J'

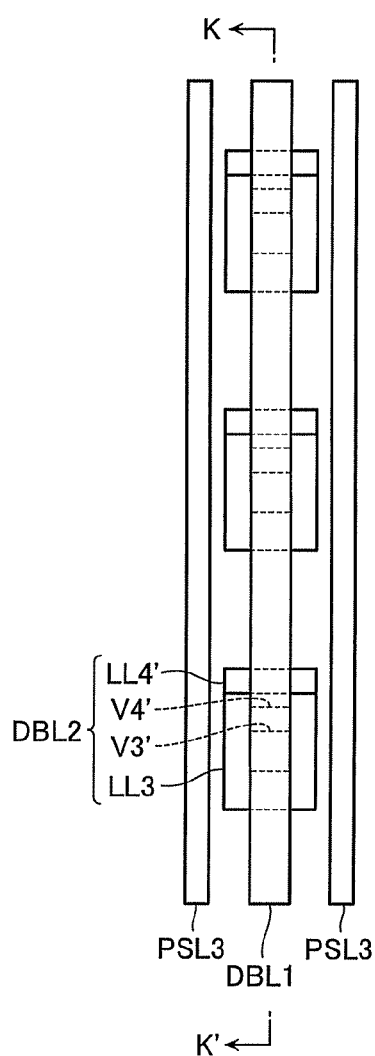 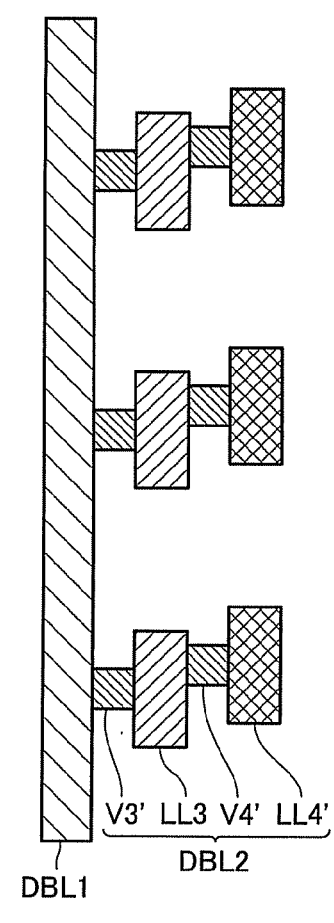
FIG. 17A
FIG. 17B
Cross-Section along K-K'

FIG. 18A
FIG. 18B
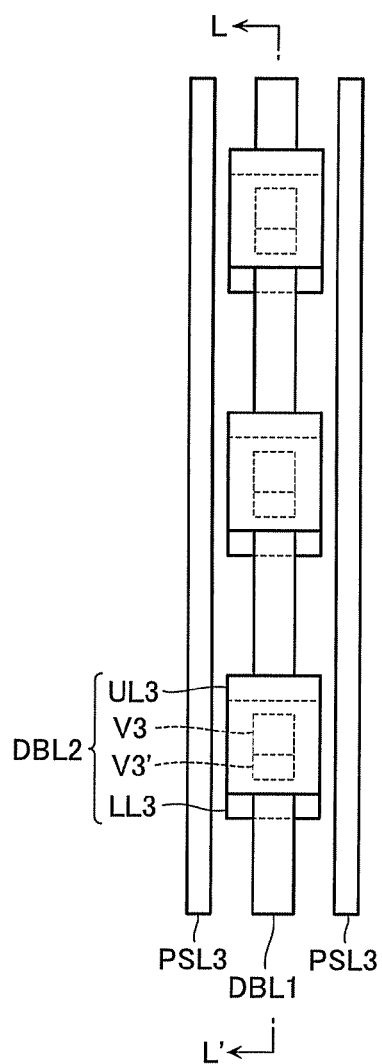
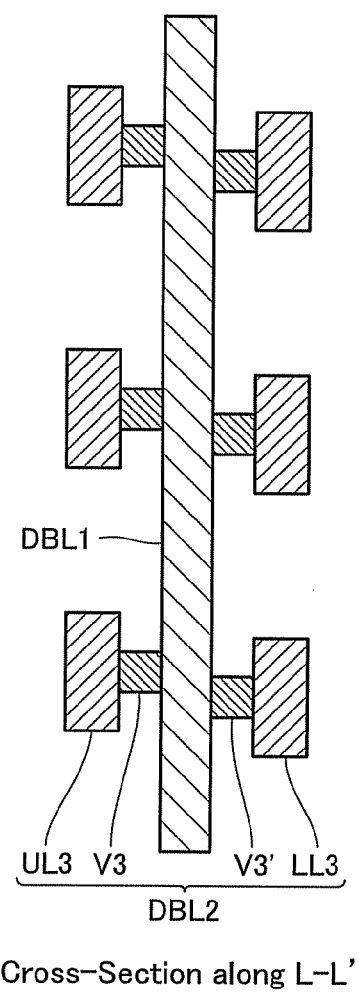
Cross-Section along L-L'

SEMICONDUCTOR MEMORY DEVICE

CROSS REFERENCE TO RELATED APPLICATIONS

This application is based on and claims the benefit of priority from prior Japanese Patent Application No. 2010-277093, filed on Dec. 13, 2010, the entire contents of which are incorporated herein by reference.

FIELD

Embodiments described herein relate to a semiconductor memory device.

BACKGROUND

In a standard semiconductor memory device, data read is performed by detecting and amplifying a signal present in a bit line at a certain timing in a sense amplifier circuit. The signal depends on data stored in a memory cell. To increase operational speed of the semiconductor memory device, it is required that a time from rise of a select signal of the memory cell to sense amplifier activation be shortened.

However, if the sense amplifier circuit is activated too early, there is an increased possibility that a detecting/amplifying operation of the sense amplifier circuit is started before a sufficient potential difference appears in a bit line pair connected to a selected memory cell, thus causing a possibility of a false read to become higher. It is therefore required to set an optimum timing at which a false read does not occur and operational speed can be increased. Activation timing of the sense amplifier circuit depends on dimension (size, width, etc.) of the memory cell array. Above all, a memory macro generator need to handle various types of memory configurations, without changing a circuit configuration thereof. Hence, it needs to set an optimum timing according to the dimension of the memory cell array.

Under such circumstances, as a technique for generating an activation signal of the sense amplifier with an appropriate timing, the following semiconductor memory device is known. In this semiconductor device, a signal read from a dummy cell is delayed by a delay circuit, and this delayed signal is supplied to the sense amplifier as a sense amplifier activation signal. This device includes dummy cells configured to store certain data in a fixed manner and having a structure identical or similar to those of a memory cell array. Moreover, a select signal is inputted to a dummy word line connected to one of these dummy cells, and, as a result, a signal read from the dummy cell to a bit line pair is delayed for a certain time by the delay circuit to generate the sense amplifier activation signal, and this sense amplifier activation signal is inputted to the sense amplifier. By forming a dummy word line and a dummy bit line having a dimension compatible with that of the memory cell array, an optimum sense amplifier activation signal compatible with memory cell dimension may be generated.

However, there is a problem that the above-described dummy cells, dummy word lines, and dummy bit lines occupy a large circuit area in the memory device, thereby hindering miniaturization of the memory device. In addition, since there is a need to fix the data stored in a dummy cell at either of "1" or "0", the dummy cell must have a different layout to that of a memory cell MC. As a result, the dummy cell array having the dummy cells arranged therein has a different continuity to the memory cell array having the memory cells arranged therein and requires design of a separate cell structure.

BRIEF DESCRIPTION OF THE DRAWINGS

FIGS. 17A and 17B show a structure of a dummy bit line DEL in a semiconductor memory device according to a modified example of the sixteenth embodiment.

FIGS. 18A and 18B show a structure of a dummy bit line DBL in a semiconductor memory device according to a seventeenth embodiment.

DETAILED DESCRIPTION

A semiconductor memory device in an embodiment described below comprises a memory cell array having memory cells arranged therein at intersections of word lines and bit lines, the word lines extending in a column direction and the bit lines extending in a row direction, the row direction being a direction perpendicular to the column direction. A row decoder is disposed on a side of the memory cell array in the column direction and is configured to supply one of the word lines with a first drive signal for selecting one of the memory cells. A sense amplifier circuit is disposed on a side of the memory cell array in the row direction and is configured to detect a change in potential of one of the bit lines and thereby determine data stored in the one of the memory cells. A dummy word line is formed extending in the column direction. A dummy bit line is formed extending in the row direction. At least one of the dummy word line and the dummy bit line is disposed outside of the memory cell array. A signal outputted from the row decoder is outputted toward the sense amplifier circuit via the dummy bit line and the dummy word line as a second drive signal. In addition, the sense amplifier circuit is configured to be activated based on the second drive signal supplied via the dummy bit line and the dummy word line.

Next, embodiments of the present invention are described in detail with reference to the drawings. Exemplified in the description of the embodiments below is the case where the present invention is applied to a static random access memory (SRAM). However, it goes without saying that the present invention is not limited to this application, and is applicable also to other semiconductor memory devices capable of employing a dummy circuit comprising an arrangement of dummy cells.

[First Embodiment]

Figure 1:
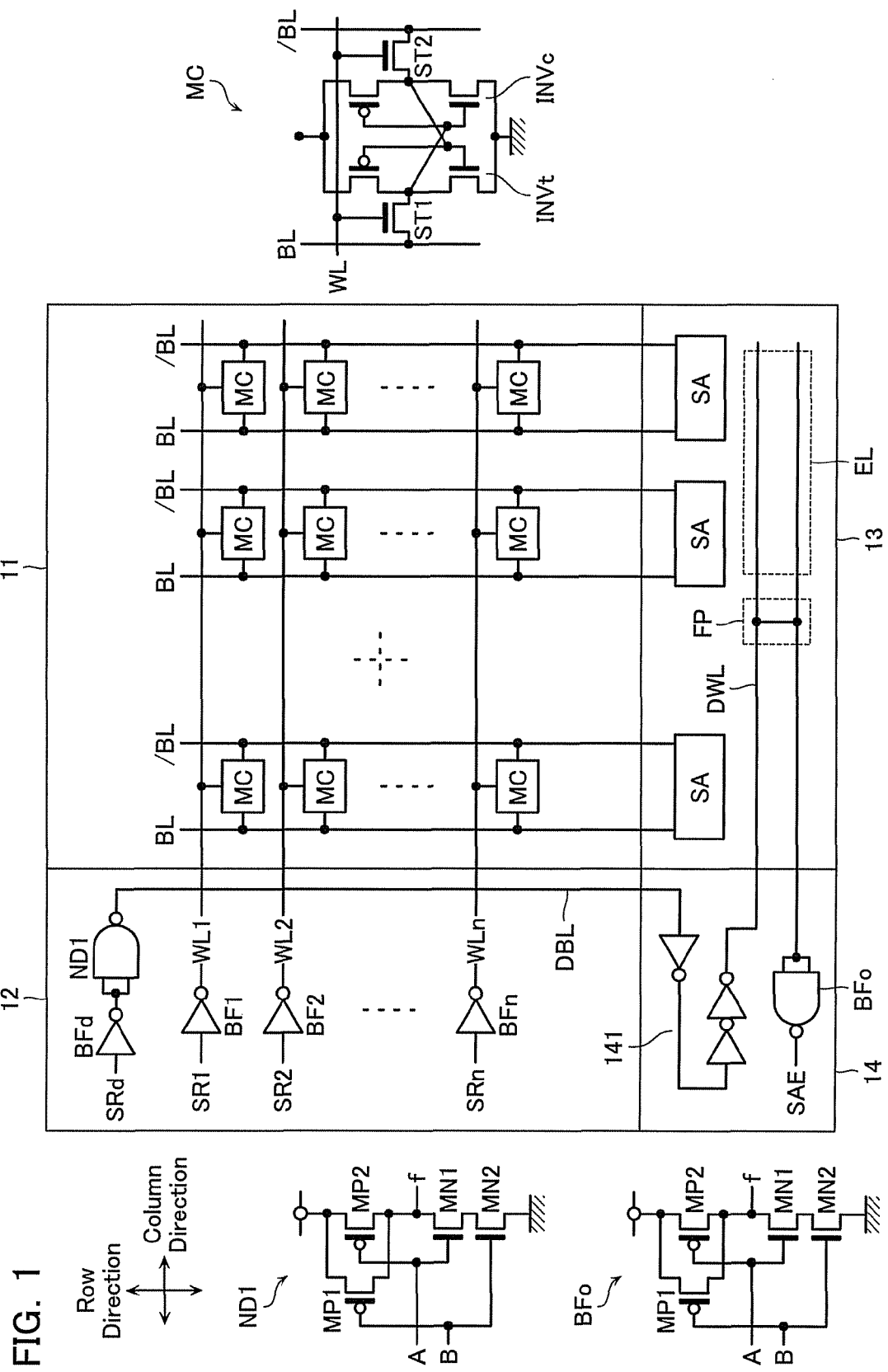
FIG. 1 is a circuit diagram showing an overall configuration of a semiconductor memory device according to a first embodiment.

First, an overall configuration of a semiconductor memory device according to a first embodiment is described with reference to FIG. 1. As shown in FIG. 1, the semiconductor memory device of the present embodiment is configured mainly from a memory cell array 11, a row decoder 12, a read/write circuit 13, a control circuit 14, a dummy bit line DBL, a delay circuit 141, a dummy word line DWL, and a buffer circuit BFo.

As shown in FIG. 1, the memory cell array 11 comprises bit line pairs BL, /BL extending in a row direction, and word lines WL extending in a column direction which is a direction perpendicular to the row direction. In addition, the memory cell array 11 is configured having a plurality of memory cells MC arranged in a matrix therein at intersections of the bit line pairs BL, /BL and the word lines WL.

Memory cells MC may comprise, for example, a pair of inverters INVt, INVc which are inverse-parallel connected, and select transistors ST1, ST2 which are provided between connection nodes of the pair of inverters INVt, INVc and the bit line pair BL, /BL.

In addition, the row decoder 12 is provided as a configuration for selecting the memory cells MC by selectively applying a select signal to any of the plurality of word lines WL. The row decoder 12 is provided at a side of the memory cell array 11 in the column direction, i.e., on an imaginary extension line of the word lines WL. The row decoder 12 is configured to receive select signals SR1-SRn (first drive signal) for selecting the memory cells MC as input from the control circuit 14. These select signals SR1-SRn are supplied, via inverters BF1-BFn acting as buffer circuits, to word lines WL1-WLn, respectively.

The read/write circuit 13 includes various kinds of circuits for performing data read, data write and the like in the memory cell array 11, for example, sense amplifier circuits SA and so on. The read/write circuit 13 and the various kinds of circuits such as the sense amplifier circuits SA are disposed at a side of the memory cell array 11 in the row direction. Although not shown in the drawings, the read/write circuit 13 also includes a pre-charge circuit for pre-charging the bit line pairs BL, /BL, a data buffer for temporarily storing write data, and so on. The sense amplifier circuit SA functions to detect/amplify a change in potential of a bit line pair BL, /BL caused by a signal read from a selected memory cell MC to the bit line pair BL, /BL, thereby determining data stored in the memory cell MC.

The control circuit 14 outputs various kinds of control signals to the row decoder 12 and the read/write circuit 13 to control the row decoder 12 and the read/write circuit 13.

In addition, a peripheral circuit region includes the row decoder 12, read/write circuit 13, and control circuit 14. The peripheral circuit region is provided with an inverter BFd as a buffer circuit, a NAND gate ND1, the dummy bit line DEL, the delay circuit 141, the dummy word line DWL, and the buffer circuit BFo. These components are provided for generating a sense amplifier activation signal SAE for activating the sense amplifier circuit SA based on a select signal SRd (second drive signal) which rises substantially simultaneously with a rise of select signals SR1-SR2. That is, the select signal SR is supplied via the dummy bit line DBL, dummy word line DWL, buffer circuit BFo, and so on, to the sense amplifier circuit SA as the sense amplifier activation signal SAE. Since the buffer circuit BFo has characteristics that mimic characteristics of the memory cell MC, the sense amplifier activation signal SAE can be generated with a timing matched to characteristics of individual memory cells.

The buffer circuit BFd receives the select signal SRd as input from the control circuit 14. An output signal of the buffer circuit BFd is inputted to the two input terminals of the NAND gate ND1. The NAND gate ND1 operates like an inverter and outputs an output signal to the delay circuit 141 via the dummy bit line DBL. The dummy bit line DBL is formed in an unoccupied region of the row decoder 12. The dummy bit line DBL is provided to have a length matched to a dimension (size, width) of the memory cell array 11. If the dimension of the memory cell array 11 increases, the resistance value and capacitance value of the word lines WL or bit lines BL also inevitably increase, whereby activation timing of the sense amplifier circuit is also delayed. Providing the dummy bit line DBL with a length and width matched to the dimension of the memory cell array 11 allows the dummy bit line DBL to be given a resistance value and capacitance value compatible with the dimension of the memory cell array 11. As a result, the sense amplifier circuit SA can be activated with a timing matched to the dimension of the memory cell array 11. Note that the delay circuit 141 maybe configured by cascade-connection of a plurality of inverters.

An output signal of the delay circuit 141 is supplied to the dummy word line DWL. The dummy word line DWL also is provided to have a length matched to the dimension (size, width) of the memory cell array 11, similarly to the dummy bit line DBL.

The dummy word line DWL preferably has a structure as shown in FIG. 1 in which the dummy word line DWL extends along the column direction and doubles back at a central vicinity of the memory cell array 11 in the column direction (symbol FP in FIG. 1). Note that, as shown in FIG. 1, extended lines EL which are an extension of the doubled-back portion FP may be omitted in certain cases.

Another end of the dummy word line DWL is connected to the buffer circuit BFo. An output signal from the buffer circuit BFo is inputted to the sense amplifier circuit SA as the sense amplifier activation signal SAE. That is, the buffer circuit BFo employs a circuit having characteristics closely resembling characteristics of the memory cell MC and here, as an example, adopts a logic gate circuit comprising two series-connected NMOS transistors, such as a NAND gate. The reason is because, as shown in FIG. 1, the NAND gate has a structure in which two NMOS transistor MN1, MN2 are series-connected. If the memory cell MC has the structure as shown in FIG. 1, charge of the pre-charged bit line pair BL, /BL is discharged via two series-connected NMOS transistors (NMOS transistor in inverter INVt or INVc and select transistor ST1 or ST2). At the same time, if the buffer circuit BFo is configured by a NAND gate as shown in FIG. 1, charge of an output terminal (f) is similarly discharged via two NMOS transistors. Hence, the buffer circuit BFo configured by a NAND gate is optimum for mimicking operation of the memory cell MC. Note that the two NMOS transistors MN1, MN2 of the NAND gate preferably have an identical threshold voltage to the NMOS transistors in the inverters INVt, INVc and the select transistors ST1, ST2 in the memory cell MC. Therefore, these transistors preferably have an identical size and undergo ion-implantation of their channels under identical conditions.

As described above, in the SRAM of the present embodiment, the sense amplifier activation signal SAE is generated using a dummy word line DWL and dummy bit line DEL having a resistance value and capacitance value substantially identical to those of the word lines WL and bit lines BL, and a buffer circuit BFo having characteristics closely resembling those of the memory cell MC. Circuit area can be reduced proportionally to the fact that dummy cells are not used ( . . . can be reduced to the extent that dummy cells are not used). In place of not using dummy cells, characteristics of the memory cells MC are mimicked by the buffer circuit BFo, hence the sense amplifier activation signal SAE can be generated with a timing that reflects variation in characteristics of the memory cells MC. Moreover, the dummy word line DWL and dummy bit line DBL are both provided in the peripheral circuit region outside of the memory cell array 11 that has a comparatively high degree of freedom in layout, hence occupied area of the memory cell array 11 can be reduced and area of the memory as a whole can be reduced.

[Second Embodiment]

Figure 2:
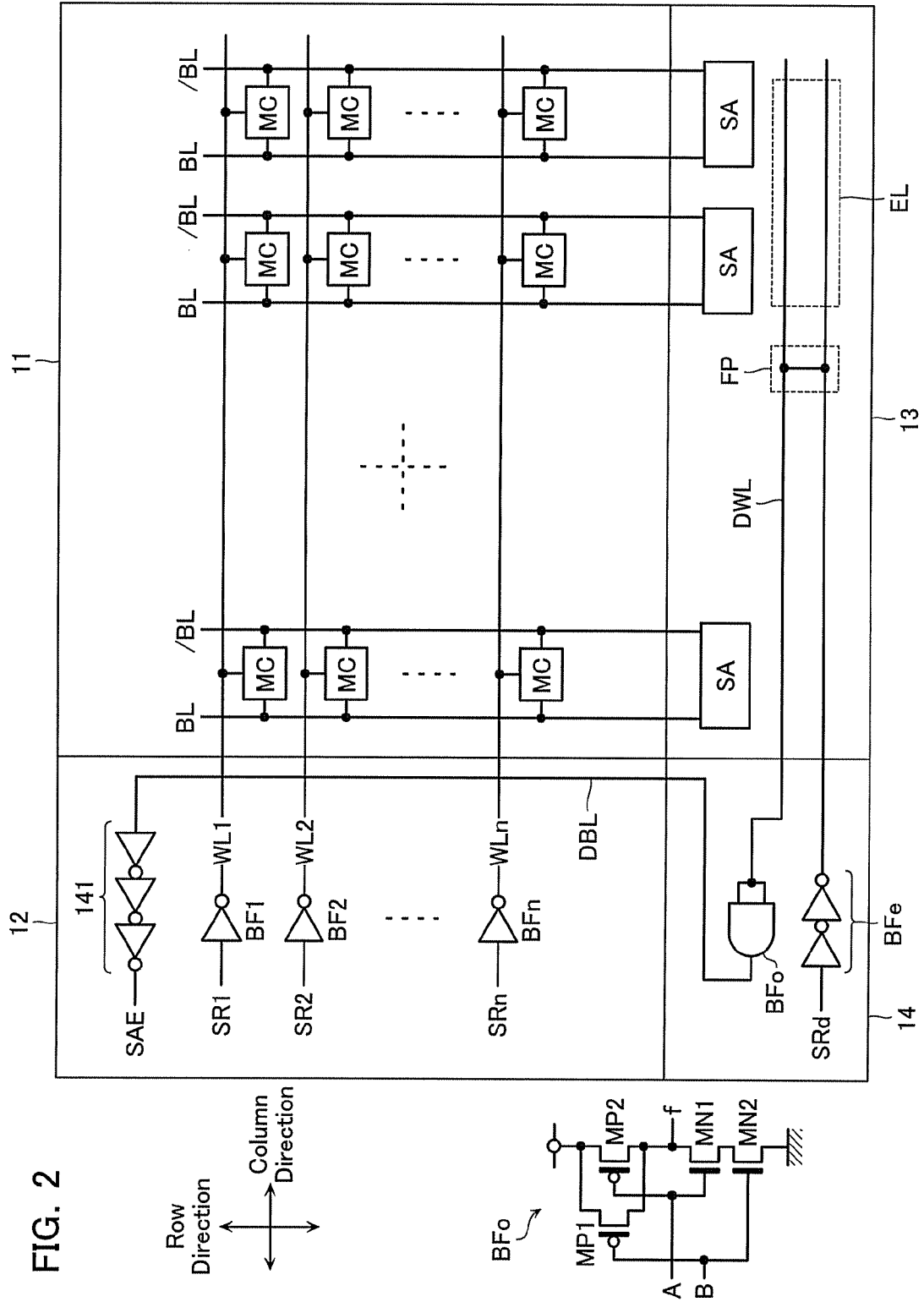
FIG. 2 is a circuit diagram showing an overall configuration of a semiconductor memory device according to a second embodiment.

Next, an overall configuration of a semiconductor memory device according to a second embodiment is described with reference to FIG. 2. In FIG. 2, components identical to those in the first embodiment are assigned with identical symbols to those used in FIG. 1, and a detailed explanation of such identical components is omitted.

In this second embodiment, the select signal SRd is first inputted to the dummy word line DWL via an inverter BFe. Then, the select signal SRd which passed through this dummy word line DWL, is inputted to the buffer circuit BFo and the dummy bit line DBL. The signal which passed through the dummy bit line DBL is inputted to the delay circuit 141, and then outputted from the delay circuit 141 as the sense amplifier activation signal SAE. In this respect, the second embodiment differs from the first embodiment in which the select signal SRd is first inputted to the dummy bit line DEL from the buffer circuit BFd and NAND gate ND1, and then inputted to the dummy word line DWL via the delay circuit 141.

In this second embodiment also, the dummy word line DWL and dummy bit line DEL are disposed in the peripheral circuit region more outward than a region where the memory cell array 11 is disposed and having the row decoder 12, read/write circuit 13, and control circuit 14 disposed therein. Moreover, dummy cells are not provided. Hence, a reduction in circuit area can be achieved similarly to in the first embodiment.

[Third Embodiment]

Figure 3:
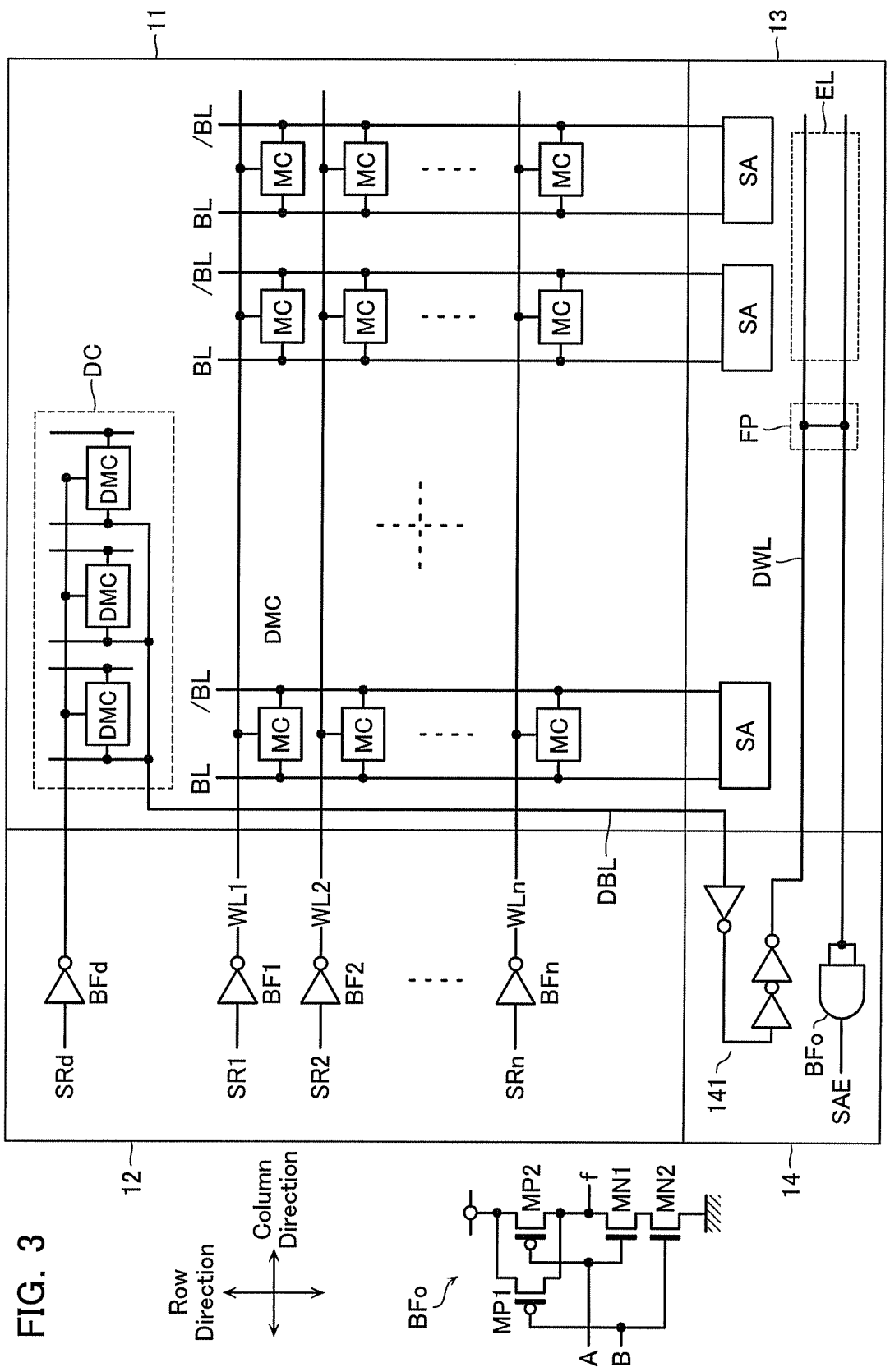
FIG. 3 is a circuit diagram showing an overall configuration of a semiconductor memory device according to a third embodiment.

Next, an overall configuration of a semiconductor memory device according to a third embodiment is described with reference to FIG. 3. In FIG. 3, components identical to those in the first embodiment are assigned with identical symbols to those used in FIG. 1, and a detailed explanation of such identical components is omitted.

This third embodiment differs from the first embodiment in that a dummy cell DC is provided within the memory cell array 11, and, as a result, the dummy bit line DEL also is formed within the memory cell array 11. That is, the third embodiment is configured such that the select signal SRd is first inputted to the buffer circuit BFd, and an output signal of the buffer circuit BFd is supplied to the dummy cell DC. When the output signal of the buffer circuit BFd is supplied to the dummy cell DC, a select transistor not shown of the dummy cell DC is turned on, whereby a signal is read out from the dummy cell DC to the dummy bit line DBL. One end of the dummy bit line DBL is connected to an input terminal of the delay circuit 141. An output terminal of the delay circuit 141 is connected to one end of the dummy word line DWL. The dummy word line DWL is formed on an unoccupied region of the read/write circuit 13, similarly to in the first embodiment.

In this embodiment, the dummy bit line DBL and dummy cell DC are provided in the memory cell array 11, hence the circuit area is proportionally increased compared with the first and second embodiments. However, the dummy word line DWL is provided outside of the memory cell array 11 similarly to in the first embodiment, hence circuit area can be sufficiently reduced compared to conventionally.

[Fourth Embodiment]

Figure 4:
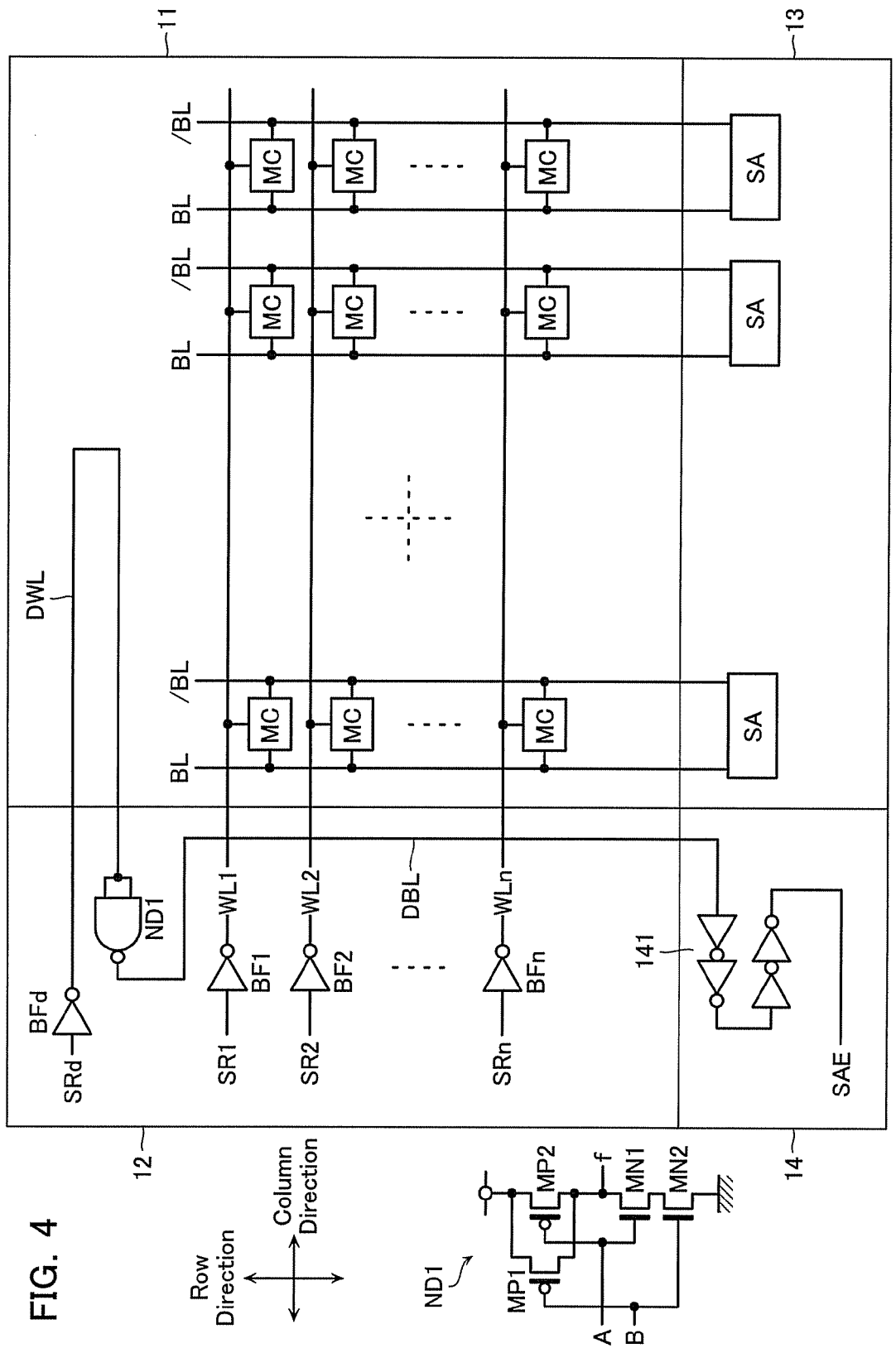
FIG. 4 is a circuit diagram showing an overall configuration of a semi conductor memory device according to a fourth embodiment.

Next, an overall configuration of a semiconductor memory device according to a fourth embodiment is described with reference to FIG. 4. In FIG. 4, components identical to those in the first embodiment are assigned with identical symbols to those used in FIG. 1, and a detailed explanation of such identical components is omitted.

In this embodiment, and contrary to the third embodiment, the dummy word line DWL is disposed within the memory cell array 11, and the dummy bit line DBL is formed outside of the memory cell array 11. The select signal SRd is inputted to the dummy word line DWL via the buffer circuit BFd and subsequently inputted via the NAND gate ND1 to the dummy bit line DBL. A signal, having passed through the dummy bit line DBL, is inputted to the delay circuit 141 configured from cascade-connection of inverters to be outputted as the sense amplifier activation signal SAE.

[Fifth Embodiment]

Figure 5A:
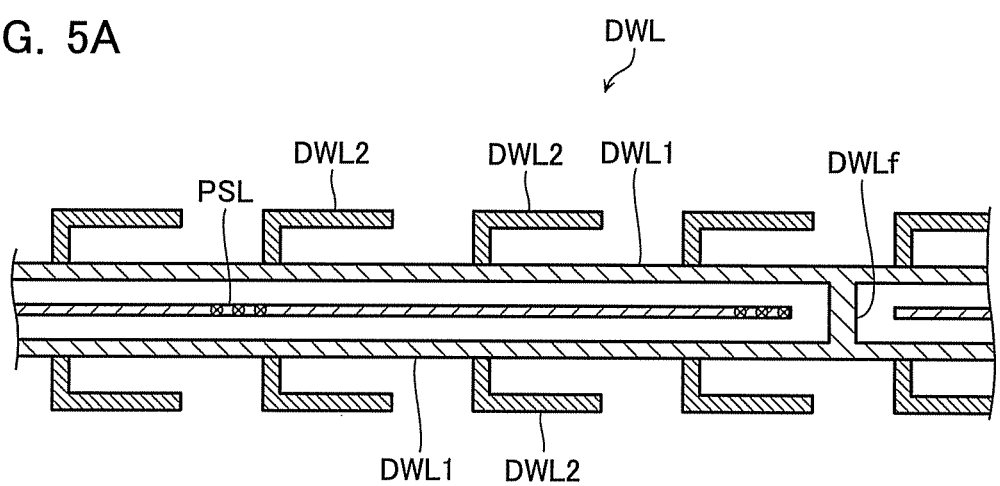
FIG. 5A shows a structure of a dummy word line DWL in a semiconductor memory device according to a fifth embodiment.

A configuration of a semiconductor memory device according to a fifth embodiment is described with reference to FIG. 5A. This embodiment has a feature in a configuration of the dummy word line DWL. Other configurations may be as in any of the first through fourth embodiments.

In this fifth embodiment, the dummy word line DWL comprises a first line DWL1 extending in the column direction and having a doubled-back structure in which the first line DWL1 is doubled back by a doubled-back line portion DWLf, and a second line DWL2 having one end connected to this first line DWL1 and the other end open. Note that in this FIG. 5A, a power source line PSL is inserted between the first line DWL1. However, this is purely an example, and the present embodiment is not limited to including this power source line PSL. The first line DWL1, second line DWL2, power source line PSL, and so on, are arranged with an identical line width and line pitch to the word lines WL in the memory cell array 11. As a result, resistance values of the word lines WL and the dummy word line DWL are aligned.

The second line DWL2 mimics a contact, shunt line and so on (not shown) connected to the word line WL. When the dummy word line DWL is formed only by the first line DWL1 matched to the dimension of the memory cell array 11, a parasitic capacitance of the dummy word line DWL as a whole is reduced compared to that of the word lines WL. The reason is because the word line WL has a contact, a shunt line or the like connected thereto. Consequently, this modified example includes the above-described second line DWL2 in order to provide the dummy word line DWL with a parasitic capacitance equivalent to this parasitic capacitance of the contact and shunt line. That concludes description of the dummy word line DWL. However, it should be noted that the dummy bit line DBL also may be given a similar structure.

Figure 5B:
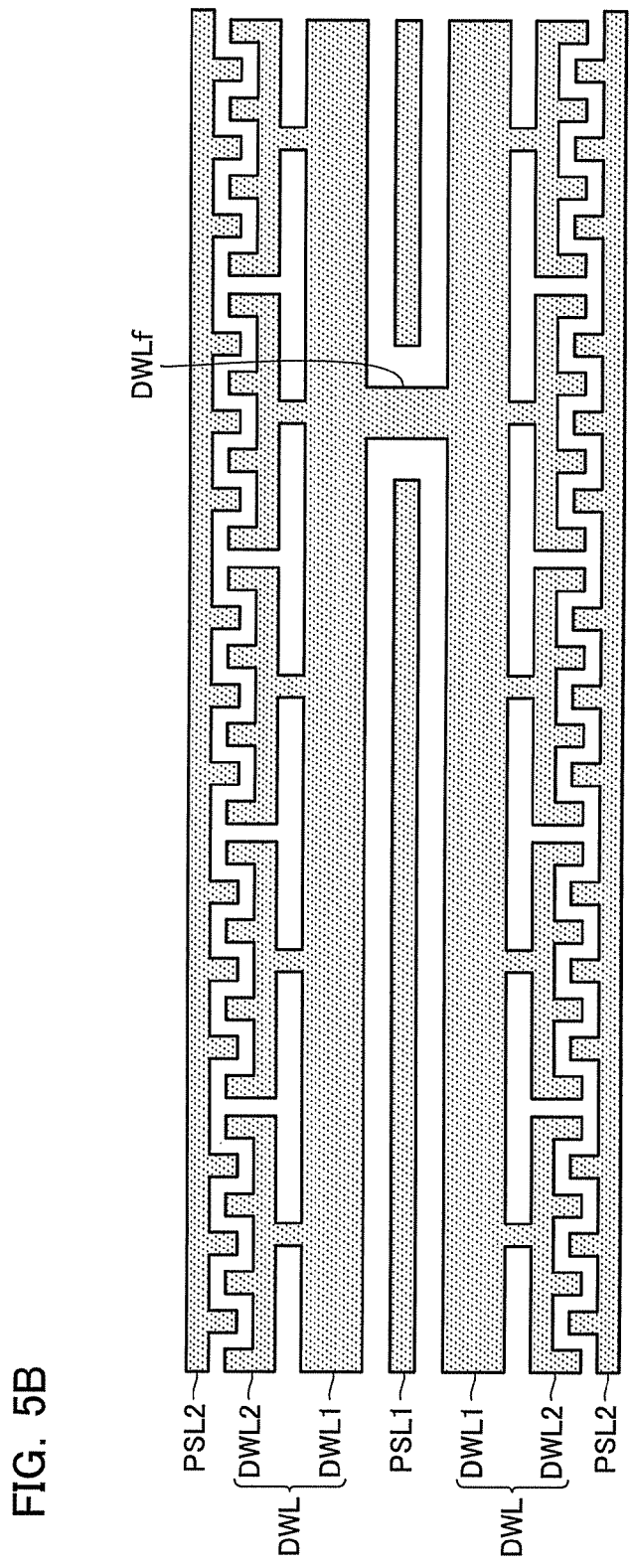
FIG. 5B shows a structure of a dummy word line DWL in a semiconductor memory device according to a modified example of the fifth embodiment.

A modified example of this fifth embodiment is shown in FIG. 5B. The dummy word line DWL in this modified example of the fifth embodiment is similar to FIG. 5A in including the first line DWL1 having the doubled-back line portion DWLf, and the second line DWL2. However, the second line DWL2 is formed in a T shape and has its outward-facing side formed in a concavo-convex shape. A power source line PSL2 laid on an outer side of the second line DWL2 also similarly has a side formed in a concavo-convex shape and is configured to mesh with the concavo-convex portion of the second line DWL2. This allows parasitic capacitance of the second line DWL2 to be increased. Note that line pitch of the first line DWL1, second line DWL2, and power source lines PSL1, PSL2 are preferably set similar to line pitch of the word lines WL in the memory cell array 11.

[Sixth Embodiment]

Figure 6A:
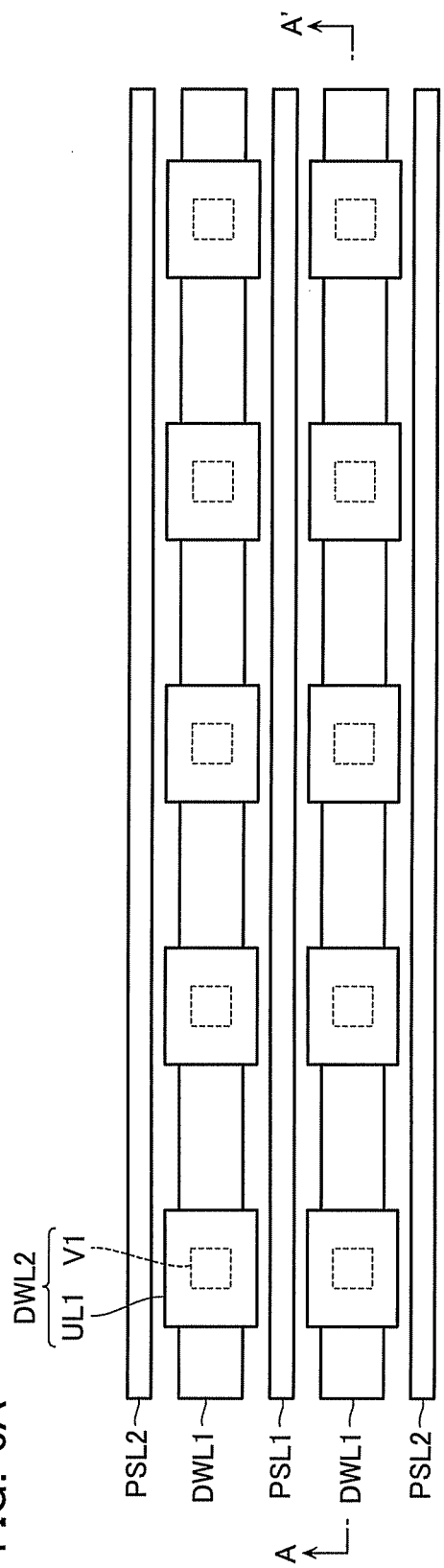
FIGS. 6A and 6B show a structure of a dummy word line DWL in a semiconductor memory device according to a sixth embodiment.
Figure 6B:
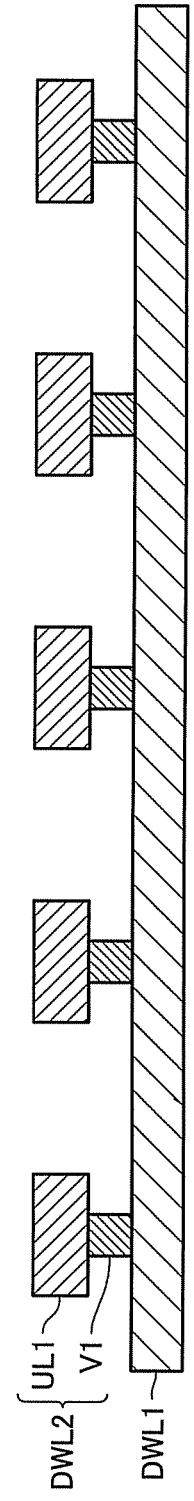

Next, a configuration of a semiconductor memory device according to a sixth embodiment is described with reference to FIGS. 6A and 6B. This embodiment has a feature in a configuration of the dummy word line DWL. Other configurations maybe as in any of the first through fourth embodiments.

The dummy word line DWL in this sixth embodiment is similar to that in the fifth embodiment in including the second line DWL2 having one end connected to the first line DWL1. However, the second line DWL2 is formed by a contact V1 formed in contact with an upper side of the first line DWL1, and an upper layer metal line UL1 configured in contact with an upper end of the contact V1. This configuration allows occupied area of the dummy word line DWL to be reduced compared to the fifth embodiment.

[Seventh Embodiment]

Figure 7A:
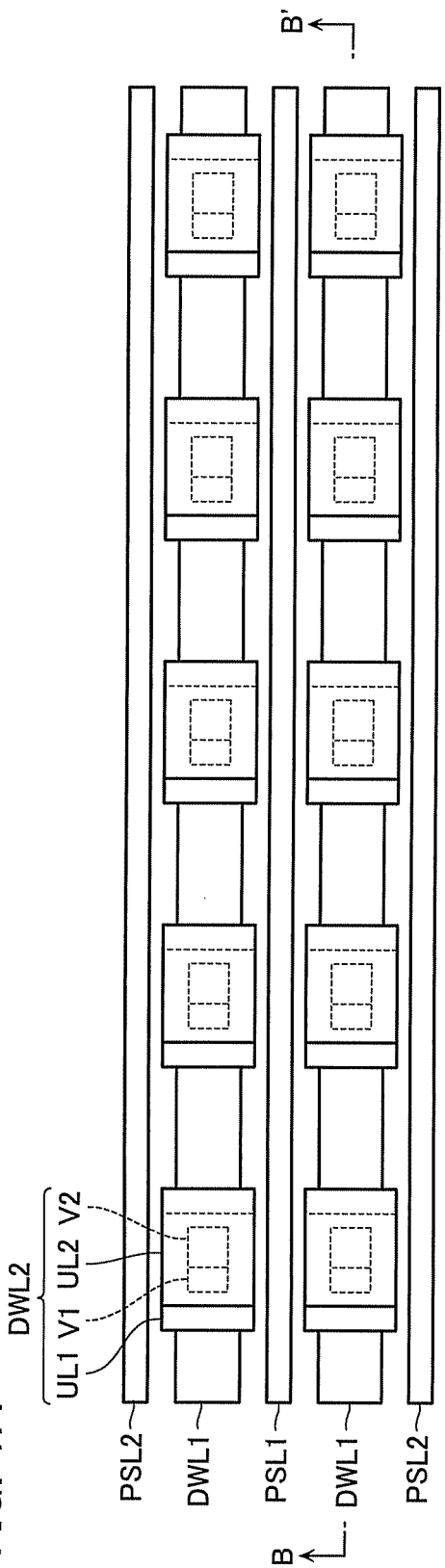
FIGS. 7A and 7B show a structure of a dummy word line DWL in a semiconductor memory device according to a seventh embodiment.
Figure 7B:
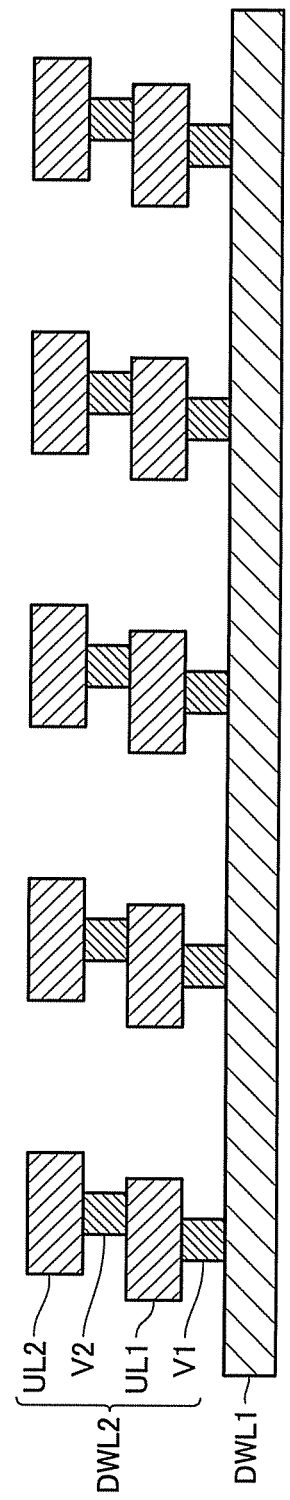

Next, a configuration of a semiconductor memory device according to a seventh embodiment is described with reference to FIGS. 7A and 7B. This embodiment has a feature in a configuration of the dummy word line DWL. Other configurations maybe as in any of the first through fourth embodiments.

The dummy word line DWL in this seventh embodiment is similar to that in the fifth embodiment in including the second line DWL2 having one end connected to the first line DWL1. However, the second line DWL2 is formed by: a contact V1 formed in contact with an upper side of the first line DWL1; an upper layer metal line UL1 configured in contact with an upper end of the contact V1; a contact V2 formed on an upper side of the upper layer metal line UL1; and an upper layer metal line UL2 configured in contact with an upper end of this contact V2. Note that the contact and upper layer metal line are not limited to two layers, and may be formed along multiple layers of three layers or more. This configuration allows parasitic capacitance of the second line DWL2 to be increased compared to the sixth embodiment, and at the same time allows increase in occupied area of the dummy word line DWL to be suppressed.

[Eighth Embodiment]

Figure 8A:
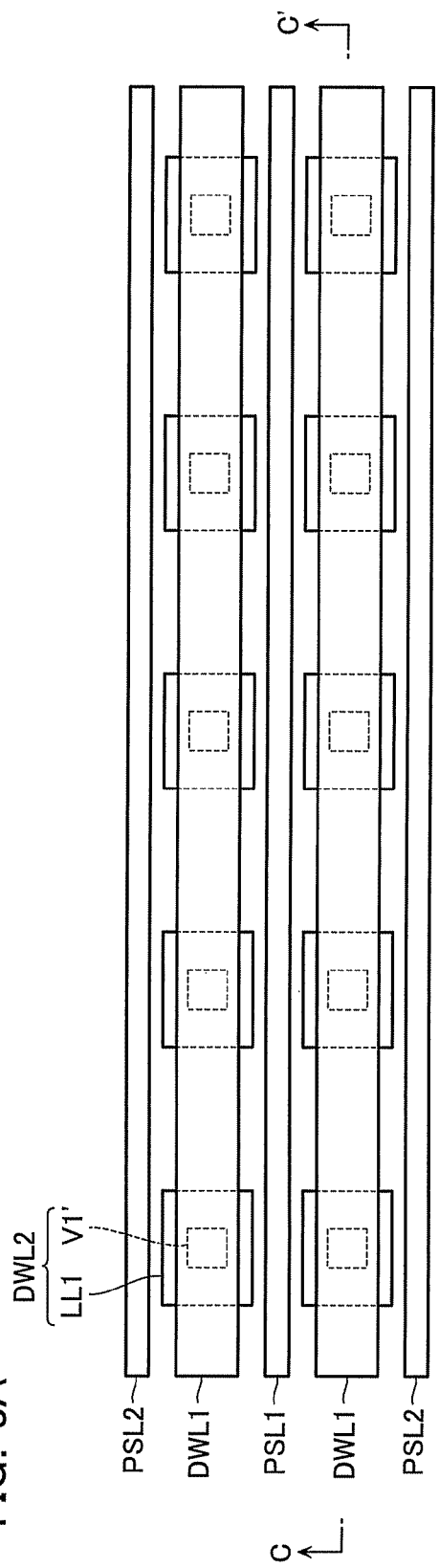
FIGS. 8A and 8B show a structure of a dummy word line DWL in a semiconductor memory device according to an eighth embodiment.
Figure 8B:
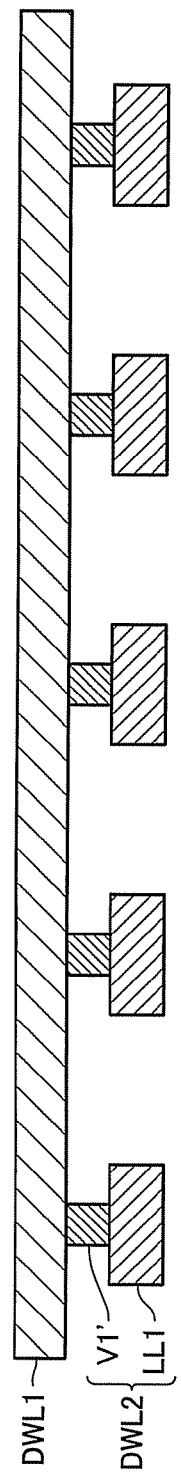

Next, a configuration of a semiconductor memory device according to an eighth embodiment is described with reference to FIGS. 8A and 8B. This embodiment has a feature in a configuration of the dummy word line DWL. Other configurations maybe as in any of the first through fourth embodiments.

The dummy word line DWL in this eighth embodiment is similar to that in the fifth embodiment in including the second line DWL2 having one end connected to the first line DWL1. However, the second line DWL2 is formed by a contact V1' formed in contact with a lower side of the first line DWL1, and a lower layer metal line LL1 configured in contact with a lower end of the contact V1'. This configuration also allows similar advantages to those of the sixth embodiment to be obtained.

[Ninth Embodiment]

Figure 9A:
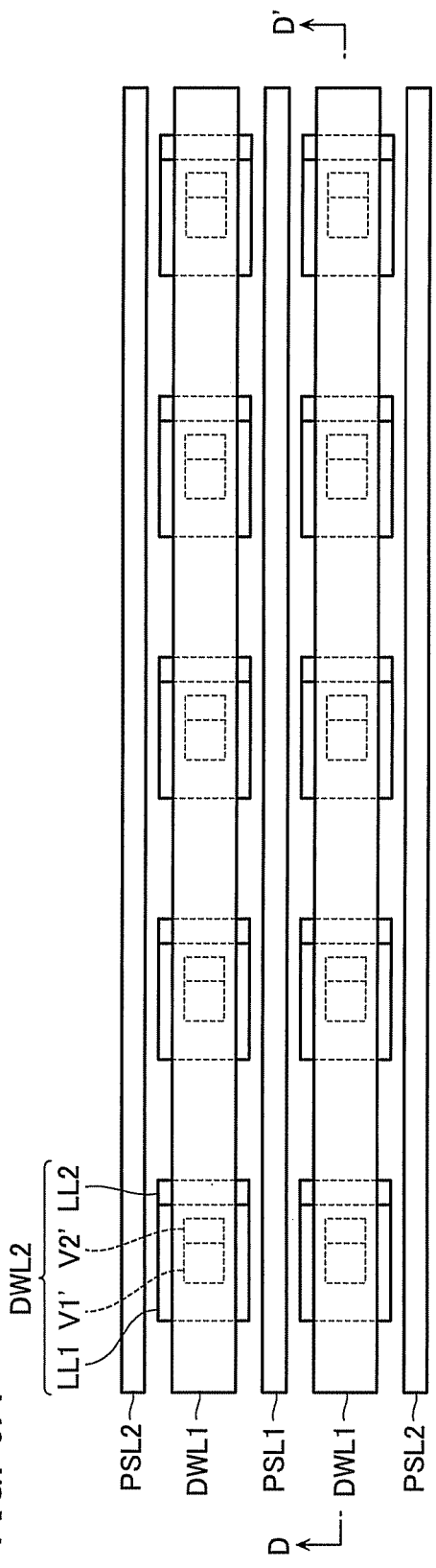
FIGS. 9A and 9B show a structure of a dummy word line DWL in a semiconductor memory device according to a ninth embodiment.
Figure 9B:
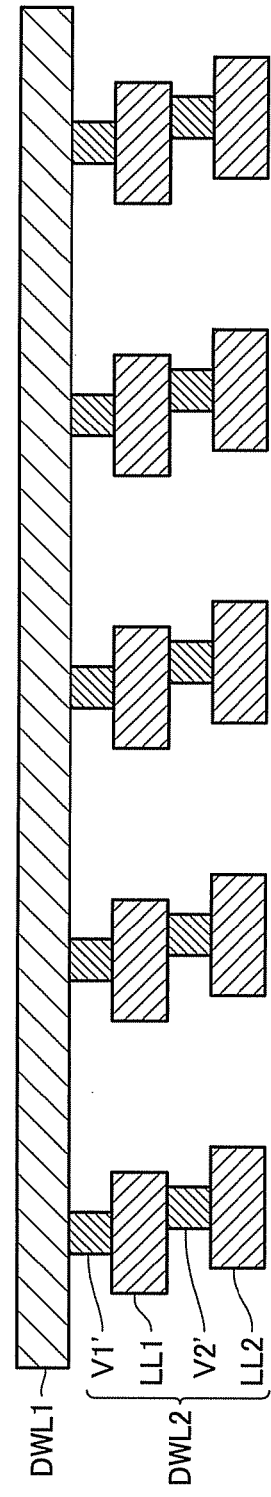

Next, a configuration of a semiconductor memory device according to a ninth embodiment is described with reference to FIGS. 9A and 9B. This embodiment has a feature in a configuration of the dummy word line DWL. Other configurations may be as in any of the first through fourth embodiments.

The dummy word line DWL in this ninth embodiment is similar to that in the fifth embodiment in including the second line DWL2 having one end connected to the first line DWL1. However, the second line DWL2 is formed by: a contact V1' formed in contact with a lower side of the first line DWL1; a lower layer metal line LL1 configured in contact with a lower end of the contact V1'; a contact V2' formed on a lower side of the lower layer metal line LL1; and a lower layer metal line LL2 configured in contact with a lower end of this contact V2. Note that the contact and lower layer metal line are not limited to two layers, and may be formed along multiple layers of three layers or more.

Figure 10A:
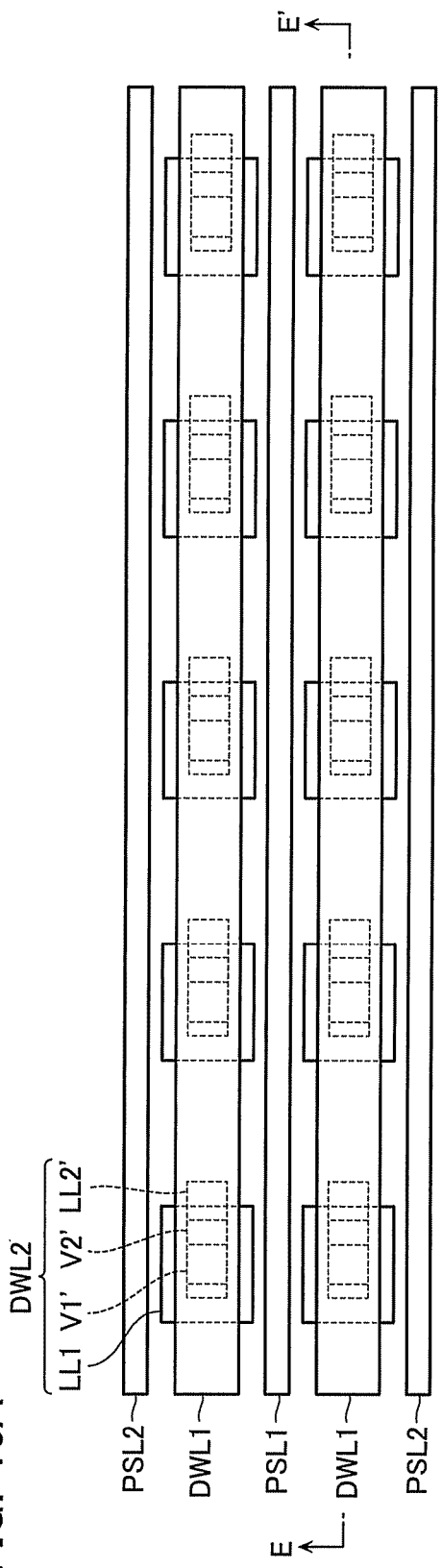
FIGS. 10A and 10B show a structure of a dummy word line DWL in a semiconductor memory device according to a modified example of the ninth embodiment.
Figure 10B:
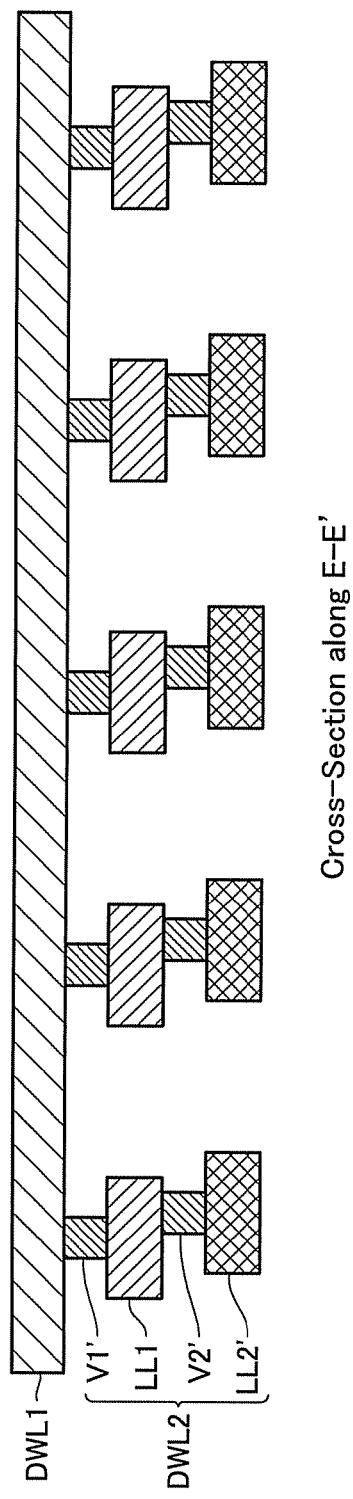

Note that, as shown in FIGS. 10A and 10B, a lower layer line LL2' formed by polysilicon may be provided in place of the metal line LL2.

[Tenth Embodiment]

Figure 11A:
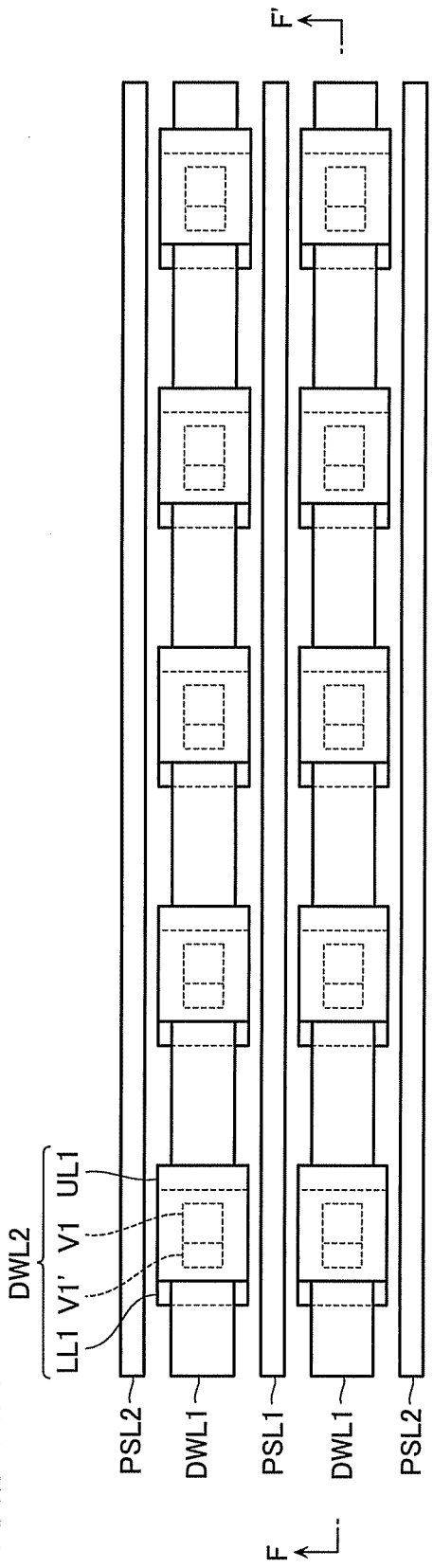
FIGS. 11A and 11B show a structure of a dummy word line DWL in a semiconductor memory device according to a tenth embodiment.
Figure 11B:
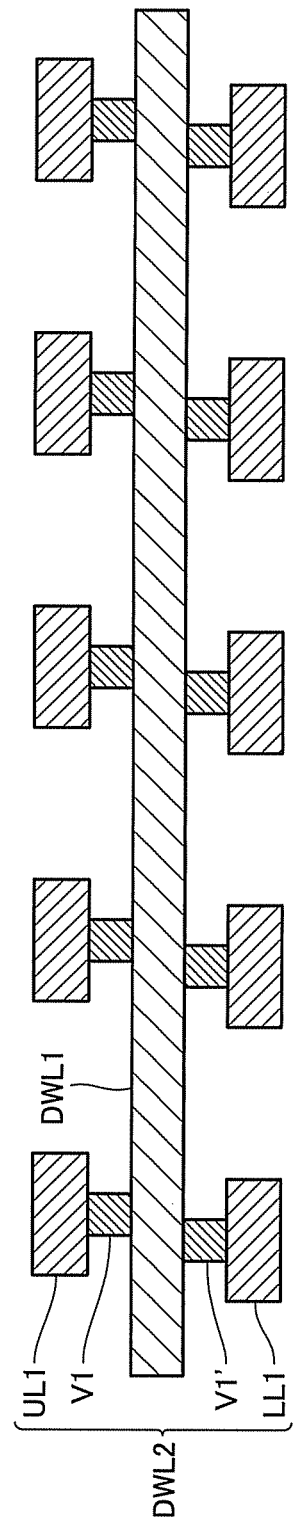

Next, a configuration of a semiconductor memory device according to a tenth embodiment is described with reference to FIGS. 11A and 11B. This embodiment has a feature in a configuration of the dummy word line DWL. Other configurations maybe as in any of the first through fourth embodiments.

The dummy word line DWL in this tenth embodiment is similar to that in the fifth embodiment in including the second line DWL2 having one end connected to the first line DWL1. However, the second line DWL2 is formed by: a contact V1 formed in contact with an upper side of the first line DWL1; an upper layer metal line UL1 configured in contact with an upper end of the contact V1; a contact V1' formed in contact with a lower side of the first line DWL1; and a lower layer metal line LL1 configured in contact with a lower end of the contact V1'. Note that the contact and upper/lower layer metal line are not limited to one layer, and may be formed along multiple layers of two layers or more.

[Eleventh Embodiment]

Figure 12A:
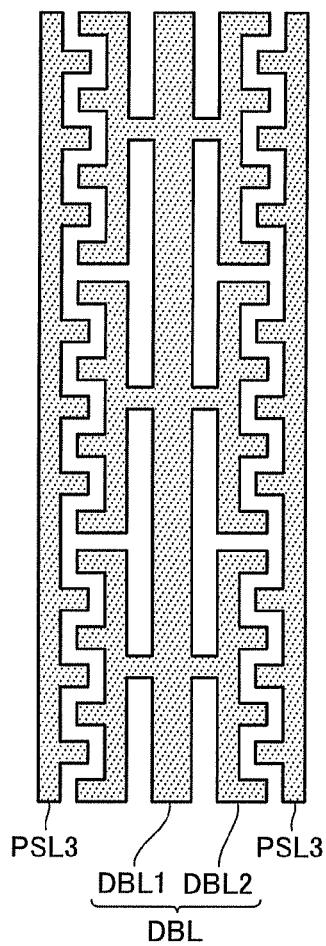
FIG. 12A shows a structure of a dummy bit line DBL in a semiconductor memory device according to an eleventh embodiment.

A configuration of a semiconductor memory device according to an eleventh embodiment is described with reference to FIG. 12A. This embodiment has a feature in a configuration of the dummy bit line DBL. Other configurations may be as in any of the first through fourth embodiments.

The dummy bit line DBL in this eleventh embodiment includes a first line DBL1 and a second line DBL2, and, in this respect, has a structure resembling that of the dummy word line DWL in the modified example of the first embodiment (FIG. 1B). The second line DBL2 is formed in a T shape and has its outward-facing side formed in a concavo-convex shape. A power source line PSL3 laid on an outer side of the second line DBL2 also similarly has a side formed in a concavo-convex shape and is configured to mesh with the concavo-convex portion of the second line DBL2. This allows parasitic capacitance of the second line DBL2 to be increased. Note that the first line DBL1, second line DBL2, power source line PSL3, and so on, are arranged with an identical line width and line pitch to the bit lines BL in the memory cell array 11. As a result, resistance values of the bit lines BL and the dummy bit line DBL are equalized.

[Twelfth Embodiment]

Figure 12B:
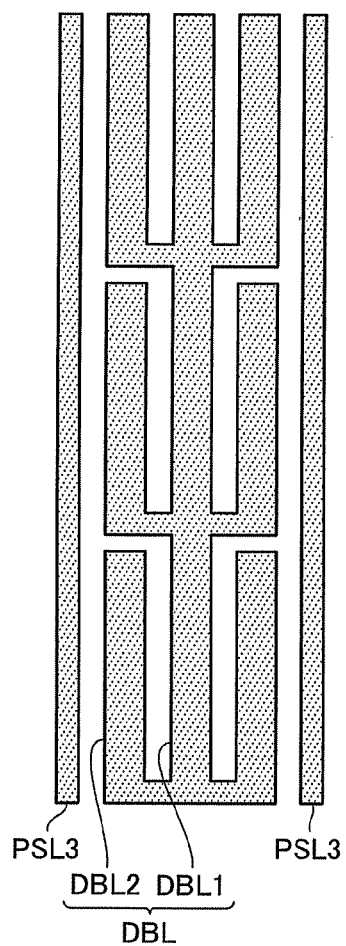
FIG. 12B shows a structure of a dummy bit line DBL in a semiconductor memory device according to a twelfth embodiment.

A configuration of a semiconductor memory device according to a twelfth embodiment is described with reference to FIG. 12B. This embodiment has a feature in a configuration of the dummy bit line DBL. Other configurations may be as in any of the first through fourth embodiments.

This twelfth embodiment differs from the eleventh embodiment in that the second line DBL2 is formed in an L shape and has its outward-facing side formed linearly.

[Thirteenth Embodiment]

Figure 13A:
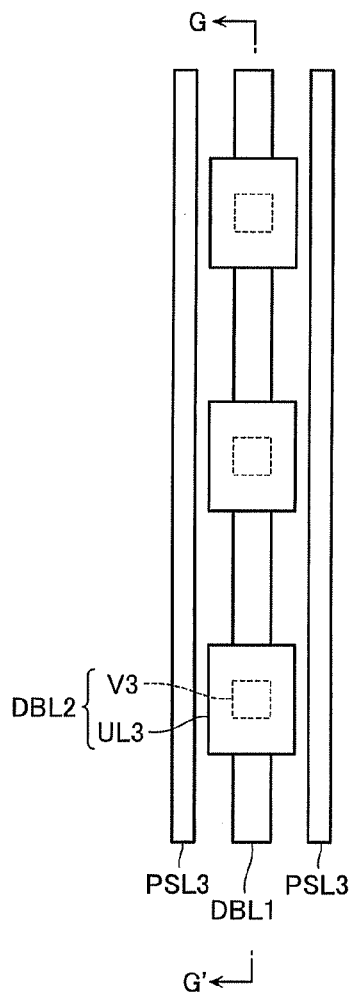
FIGS. 13A and 13B show a structure of a dummy bit line DBL in a semiconductor memory device according to a thirteenth embodiment.
Figure 13B:
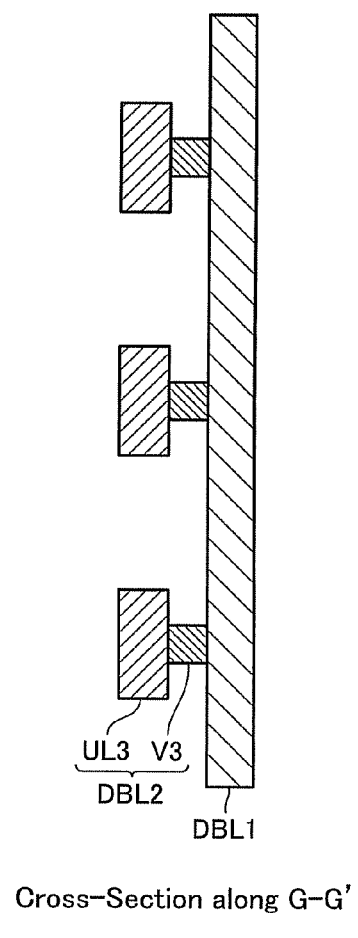

Next, a configuration of a semiconductor memory device according to a thirteenth embodiment is described with reference to FIGS. 13A and 13B. This embodiment has a feature in a configuration of the dummy bit line DBL. Other configurations may be as in any of the first through fourth embodiments.

The dummy bit line DBL in this thirteenth embodiment is similar to that in aforementioned embodiments in including the second line DBL2 having one end connected to the first line DBL1. However, the second line DBL2 is formed by a contact V3 formed in contact with an upper side of the first line DBL1, and an upper layer metal line UL3 configured in contact with an upper end of the contact V3.

[Fourteenth Embodiment]

Figure 14A:
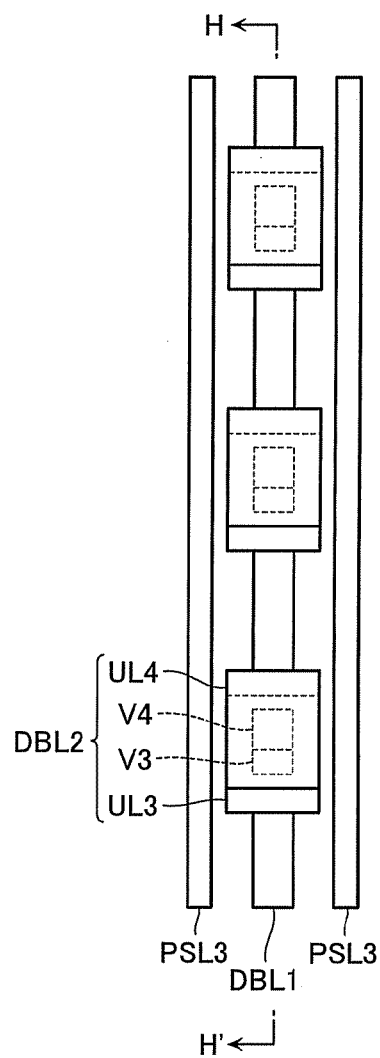
FIGS. 14A and 14B show a structure of a dummy bit line DEL in a semiconductor memory device according to a fourteenth embodiment.
Figure 14B:
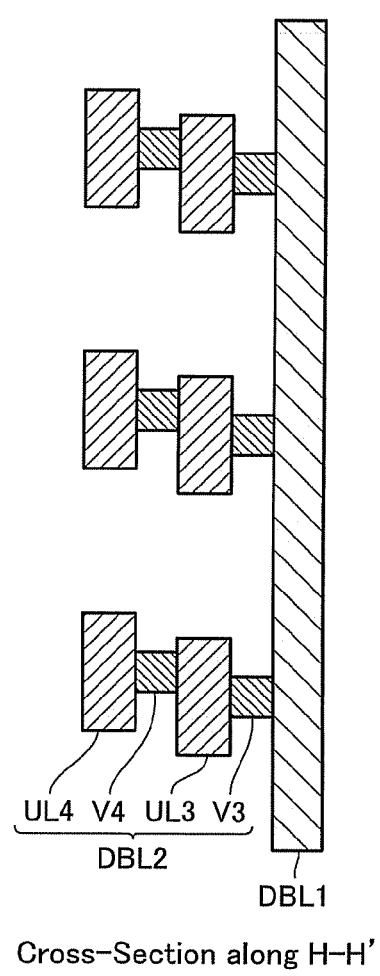

Next, a configuration of a semiconductor memory device according to a fourteenth embodiment is described with reference to FIGS. 14A and 14B. This embodiment has a feature in a configuration of the dummy bit line DBL. Other configurations may be as in any of the first through fourth embodiments.

The dummy bit line DBL in this fourteenth embodiment is similar to that in aforementioned embodiments in including the second line DBL2 having one end connected to the first line DBL1. However, the second line DBL2 is formed by a contact V3 formed in contact with an upper side of the first line DBL1, an upper layer metal line UL3 configured in contact with an upper end of the contact V3, a contact V4 formed on an upper side of the upper layer metal line UL3, and an upper layer metal line UL4 configured in contact with an upper end of this contact V4. Note that the contact and upper layer metal line are not limited to two layers, and may be formed along multiple layers of three layers or more.

[Fifteenth Embodiment]

Figure 15A:
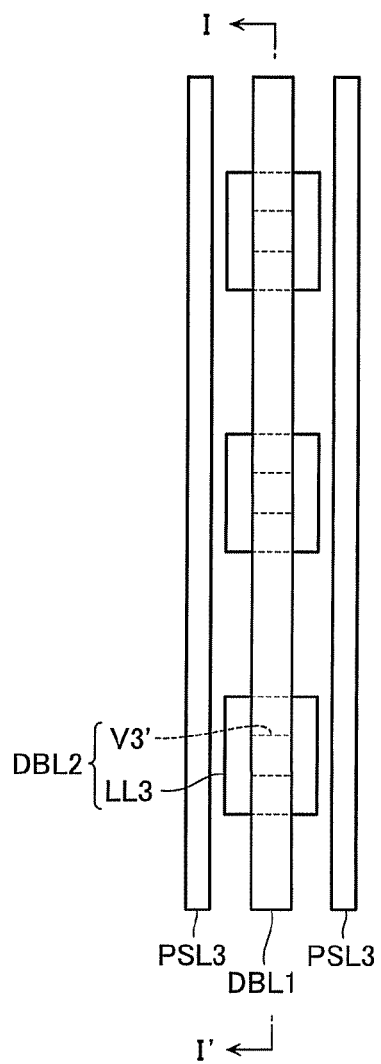
FIGS. 15A and 15B show a structure of a dummy bit line DBL in a semiconductor memory device according to a fifteenth embodiment.
Figure 15B:
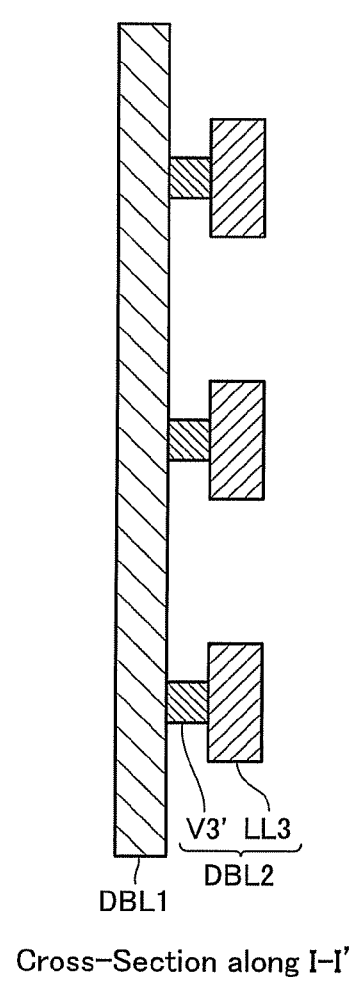

Next, a configuration of a semiconductor memory device according to a fifteenth embodiment is described with reference to FIGS. 15A and 15B. This embodiment has a feature in a configuration of the dummy bit line DBL. Other configurations may be as in any of the first through fourth embodiments.

The dummy bit line DBL in this fifteenth embodiment is similar to that in aforementioned embodiments in including the second line DBL2 having one end connected to the first line DBL1. However, the second line DBL2 is formed by a contact V3' formed in contact with a lower side of the first line DBL1, and a lower layer metal line LL3 configured in contact with a lower end of the contact V3'.

[Sixteenth Embodiment]

Figure 16A:
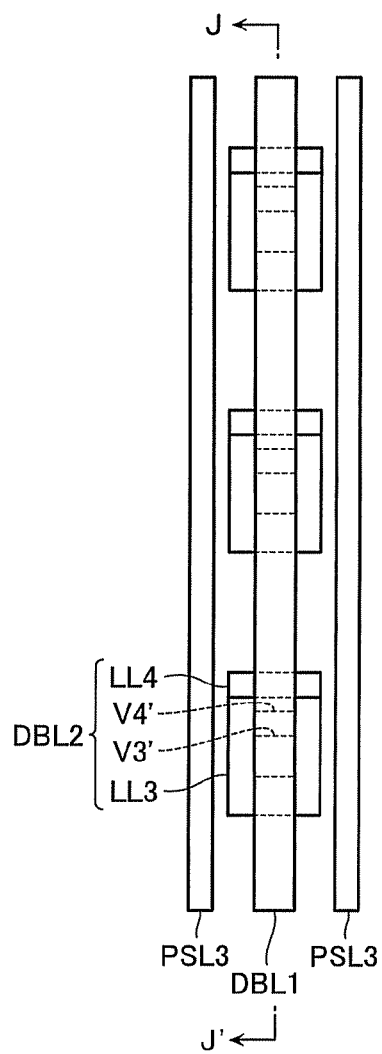
FIGS. 16A and 16B show a structure of a dummy bit line DBL in a semiconductor memory device according to a sixteenth embodiment.
Figure 16B:
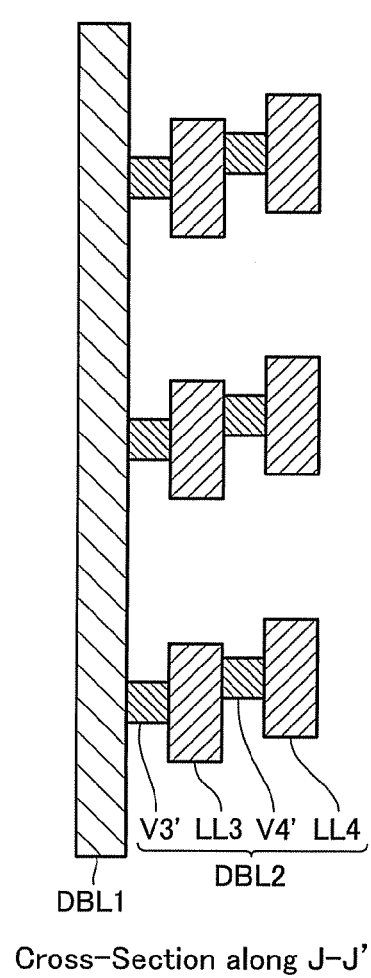

Next, a configuration of a semiconductor memory device according to a sixteenth embodiment is described with reference to FIGS. 16A and 16B. This embodiment has a feature in a configuration of the dummy bit line DBL. Other configurations maybe as in any of the first through fourth embodiments.

The dummy bit line DBL in this sixteenth embodiment is similar to that in aforementioned embodiments in including the second line DBL2 having one end connected to the first line DBL1. However, the second line DBL2 is formed by a contact V3' formed in contact with a lower side of the first line DBL1, a lower layer metal line LL3 configured in contact with a lower end of the contact V3', a contact V4' formed on a lower side of the lower layer metal line LL3, and a lower layer metal line LL4 configured in contact with a lower end of this contact V4. Note that the contact and lower layer metal line are not limited to two layers, and may be formed along multiple layers of three layers or more.

Note that, as shown in FIGS. 17A and 17B, a lower layer line LL4' formed by polysilicon may be provided in place of the metal line LL4.

[Seventeenth Embodiment]

Next, a configuration of a semiconductor memory device according to a seventeenth embodiment is described with reference to FIGS. 18A and 18B. This embodiment has a feature in a configuration of the dummy bit line DBL. Other configurations maybe as in any of the first through fourth embodiments.

The dummy bit line DBL in this seventeenth embodiment is similar to that in aforementioned embodiments in including the second line DBL2 having one end connected to the first line DBL1. However, the second line DBL2 is formed by a contact V3 formed in contact with an upper side of the first line DELI, an upper layer metal line UL3 configured in contact with an upper end of the contact V3, a contact V3' formed in contact with a lower side of the first line DBL1, and a lower layer metal line LL3 configured in contact with a lower end of the contact V3'. Note that the contact and upper/lower layer metal line are not limited to one layer, and may be formed along multiple layers of two layers or more.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, the plurality of examples of the dummy word line DWL or dummy bit line DBL mentioned above may also be used in a combined manner in one semiconductor memory device.

What is claimed is:

1. A semiconductor memory device comprising:
a memory cell array having memory cells arranged therein at intersections of word lines and bit lines, the word lines extending in a column direction and the bit lines extending in a row direction, the row direction being a direction perpendicular to the column direction;
a row decoder disposed on a side of the memory cell array in the column direction and configured to supply one of the word lines with a first drive signal for selecting one of the memory cells;
a sense amplifier circuit disposed on a side of the memory cell array in the row direction and configured to detect a change in potential of one of the bit lines and thereby determine data stored in one of the memory cells;
a dummy word line formed extending in the column direction;
a dummy bit line formed extending in the row direction; and
a buffer circuit connected directly to the dummy word line,
at least one of the dummy word line and the dummy bit line being disposed outside of the memory cell array,
a signal being outputted toward the sense amplifier circuit via the dummy bit line and the dummy word line as a second drive signal,
the sense amplifier circuit being configured to be activated based on the second drive signal, and
the buffer circuit being configured by a logic gate circuit including two NMOS transistors connected in series, one of the two NMOS transistors having a source connected to a drain of the other one of the two NMOS transistors.

2. The semiconductor memory device of claim 1 wherein the NMOS transistors included in the logic gate circuit have a threshold voltage identical to that of an NMOS transistor included in the memory cells.

3. The semiconductor memory device of claim 1, wherein the dummy word line or the dummy bit line includes a first line and a second line, the second line having one end connected to a part of the first line and the other end open.

4. The semiconductor memory device of claim 3, wherein the second line has a T shape, and has one side facing a power source line.

5. The semiconductor memory device of claim 4, wherein a wiring pitch of the first line, the second line and the power source line is substantially identical to that of the word lines.

6. The semiconductor memory device of claim 3, wherein the second line comprises a contact formed to contact the first line, and a metal line contacting an upper end of the contact.

7. A semiconductor memory device comprising:
a memory cell array having memory cells arranged therein at intersections of word lines and bit lines, the word lines extending in a column direction and the bit lines extending in a row direction, the row direction being a direction perpendicular to the column direction;
a row decoder disposed on a side of the memory cell array in the column direction and configured to supply one of the word lines with a first drive signal for selecting one of the memory cells;
a sense amplifier circuit disposed on a side of the memory cell array in the row direction and configured to detect a change in potential of one of the bit lines and thereby determine data stored in one of the memory cells;
a dummy word line formed extending in the column direction; and
a dummy bit line formed extending in the row direction,
at least one of the dummy word line and the dummy bit line being disposed outside of the memory cell array,
a signal being outputted toward the sense amplifier circuit via the dummy bit line and the dummy word line as a second drive signal, and
the sense amplifier circuit being configured to be activated based on the second drive signal, wherein
the dummy word line or the dummy bit line includes a first line and a second line, the second line having one end connected to a part of the first line and the other end open.

8. The semiconductor memory device of claim 7, further comprising a buffer circuit connected directly to the dummy word line,
wherein the buffer circuit is configured by a logic gate circuit including two NMOS transistors connected in series, one of the two NMOS transistors having a source connected to a drain of the other one of the two NMOS transistors.

9. The semiconductor memory device of claim 8, wherein the NMOS transistors included in the logic gate circuit have a threshold voltage identical to that of an NMOS transistor included in the memory cells.

10. The semiconductor memory device of claim 7, wherein the second line has a T shape, and has one side facing a power source line.

11. The semiconductor memory device of claim 10, wherein a wiring pitch of the first line, the second line and the power source line is substantially identical to that of the word lines.

12. The semiconductor memory device of claim 7, wherein the second line comprises a contact formed to contact the first line, and a metal line contacting an upper end of the contact.

13. The semiconductor memory device of claim 7, wherein the second line comprises a first contact formed to contact a first surface of the first line, a first metal line contacting an upper end of the first contact, a second contact formed to contact a second surface of the first line, and a second metal line contacting an upper end of the second contact.

14. The semiconductor memory device of claim 1, wherein the dummy word line has a structure in which the dummy word line extends from the row decoder and is doubled back at an intermediate position in the column direction of a memory cell array region where the memory cell array is disposed.

15. A semiconductor memory device comprising:
a memory cell array having memory cells arranged therein at intersections of word lines and bit lines, the word lines extending in a column direction and the bit lines extending in a row direction, the row direction being a direction perpendicular to the column direction;
a row decoder disposed on a side of the memory cell array in the column direction and configured to supply one of the word lines with a first drive signal for selecting one of the memory cells;
a sense amplifier circuit disposed on a side of the memory cell array in the row direction and configured to detect a change in potential of one of the bit lines and thereby determine data stored in one of the memory cells;
a dummy word line formed extending in the column direction;
a dummy bit line formed extending in the row direction; and
a buffer circuit configured to drive the dummy bit line, the buffer circuit being configured by a logic gate circuit including two NMOS transistors connected in series, at least one of the dummy word line and the dummy bit line being disposed outside of the memory cell array, a signal being outputted toward the sense amplifier circuit via the dummy bit line and the dummy word line as a second drive signal, and the sense amplifier circuit being configured to be activated based on a second drive signal.

16. The semiconductor memory device of claim 1, wherein the buffer circuit is connected between the dummy word line and the dummy bit line.

17. The semiconductor memory device of claim 7, wherein the dummy word line has a structure in which the dummy word line extends from the row decoder and is doubled back at an intermediate position in the column direction of a memory cell array region where the memory cell array is disposed.

18. The semiconductor memory device of claim 7, further comprising a buffer circuit connected between the dummy word line and the dummy bit line, wherein the buffer circuit is configured by a logic gate circuit including two NMOS transistors connected in series.

19. The semiconductor memory device of claim 15, wherein the buffer circuit is connected between the dummy word line and the dummy bit line.

* * * * *